United States Patent
Cha et al.

(10) Patent No.: US 8,853,671 B2
(45) Date of Patent: Oct. 7, 2014

(54) NANOROD LIGHT EMITTING DEVICE AND METHOD OF MANUFACTURING THE SAME

(71) Applicant: Samsung Electronics Co., Ltd., Gyeonggi-do (KR)

(72) Inventors: Nam-Goo Cha, Gyeonggi-do (KR); Geon-Wook Yoo, Gyeonggi-do (KR); Han-Kyu Seong, Seoul (KR); Sam-Mook Kang, Gyeonggi-do (KR); Hun-Jae Chung, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 165 days.

(21) Appl. No.: 13/657,357

(22) Filed: Oct. 22, 2012

(65) Prior Publication Data

US 2013/0099199 A1    Apr. 25, 2013

(30) Foreign Application Priority Data

Oct. 21, 2011    (KR) ........................ 10-2011-0108114

(51) Int. Cl.
| | |
|---|---|
| *H01L 29/06* | (2006.01) |
| *H01L 33/00* | (2010.01) |
| *H01L 33/38* | (2010.01) |
| *H01L 33/18* | (2010.01) |
| *H01L 33/08* | (2010.01) |
| *H01L 33/24* | (2010.01) |
| *H01L 33/44* | (2010.01) |

(52) U.S. Cl.
CPC .............. *H01L 33/18* (2013.01); *H01L 33/385* (2013.01); *H01L 33/08* (2013.01); *H01L 33/24* (2013.01); *H01L 33/007* (2013.01); *H01L 33/44* (2013.01)
USPC ................................. 257/13; 257/79; 257/88

(58) Field of Classification Search
CPC ..... H01L 33/385; H01L 33/13; H01L 33/007; H01L 33/08; H01L 33/24; H01L 33/44
USPC ......... 257/13, 79, 84, 85, 88, 89, 90, E33.008
See application file for complete search history.

(56) References Cited

U.S. PATENT DOCUMENTS

| | | | |
|---|---|---|---|
| 8,378,349 B2* | 2/2013 | Ko et al. | 257/59 |
| 8,586,977 B2* | 11/2013 | Obana et al. | 257/40 |
| 8,587,003 B2* | 11/2013 | Ando | 257/89 |

FOREIGN PATENT DOCUMENTS

| | | |
|---|---|---|
| JP | 2009-147140 A | 7/2009 |
| KR | 10-2010-0028412 A | 3/2010 |
| KR | 10-2011-0040676 A | 4/2011 |
| KR | 10-2011-0046017 A | 5/2011 |

* cited by examiner

*Primary Examiner* — Hung Vu
(74) *Attorney, Agent, or Firm* — McDermott Will & Emery LLP (57) ABSTRACT

A nanorod light emitting device and a method of manufacturing the same. The nanorod light emitting device may include at least one nitride semiconductor layer, light emitting nanorods formed on the nitride semiconductor layer and spaced apart from each other, and a first filling layer, a conductive layer, and a second filling layer formed in spaces between the light emitting nanorods.

14 Claims, 7 Drawing Sheets

NANOROD LIGHT EMITTING DEVICE AND METHOD OF MANUFACTURING THE SAME

CROSS-REFERENCE TO RELATED APPLICATIONS

This application claims the benefit of Korean Patent Application No. 10-2011-0108114, filed on Oct. 21, 2011, in the Korean Intellectual Property Office, the disclosure of which is incorporated herein by reference in its entirety.

BACKGROUND

The present disclosure relates generally to nanorod light emitting devices.

Some modern light emitting devices produce light by using a combination of electrons and holes to inject electrical charge into a p-n junction structure corresponding to an active layer of a semiconductor. When electrons and holes are combined in an active layer of a semiconductor light emitting device, energy corresponding to an energy bandgap of the active layer may be emitted in the form of light, a phenomenon known as electroluminescence. Accordingly, the wavelength of light emitted from the semiconductor light emitting device may vary according to the size of the energy bandgap of the active layer. Examples of such semiconductor based light emitting devices include, but are not limited to, light emitting diodes (LEDs) and laser diodes (LDs). In particular, LEDs are generally regarded as being low-cost devices that are relatively efficient and environmentally friendly sources of light. This is particularly due to their ability to produce a relatively high level of brightness with relatively low power consumption. Consequently, LEDs are commonly used today as the preferred light source for a variety of general consumer products and electronic devices including, for example, displays, optical communications, motor vehicles, and other general devices that require a light source.

Recent developments in LED technology include the introduction of blue LEDs and ultraviolet LEDs using nitrides (or nitrogen based compounds). These new types of LEDs are known to have superior physical and chemical characteristics relative to conventional LEDs. Also, since a blue LED or ultraviolet LED may be combined with fluorescent material to produce either white light or other monochromatic light, these new LEDs have extended the range of applications for semiconductor light emitting devices in general. However, the nitride-based compound semiconductor crystals used to produce blue and ultraviolet LEDs are known to suffer from multiple defects. Defects in semiconductor crystals are generally caused by a mismatch in lattice constants or a difference in thermal expansion coefficients between a substrate and a compound semiconductor. Regardless of the cause of the defect, applying electrical charge by combining electrons and holes in crystals having defects may result in heat energy to be emitted by the LED instead of light energy, which in turn may reduce the luminous efficiency of the LED.

SUMMARY

The present disclosure provides a nanorod light emitting device capable of increasing a current injection efficiency to increase a luminous efficiency.

The present disclosure also provides a method of manufacturing a nanorod light emitting device capable of increasing a current injection efficiency.

According to an aspect of the present disclosure, there is provided a nanorod light emitting device including at least one nitride semiconductor layer; a mask layer formed on the at least one nitride semiconductor layer and having through holes; light emitting nanorods each including a nanocore protruding from the through hole and doped with a first-type impurity, an emission layer formed on a surface of the nanocore, and a semiconductor layer formed on a surface of the emission layer and doped with a second-type impurity; a first filling layer formed on the mask between the light emitting nanorods and having a height less than the height of the light emitting nanorods; a first conductive layer formed on surfaces of the semiconductor layer and the first filling layer; a second filling layer formed on the first conductive layer between the light emitting nanorods; a first electrode formed on the second filling layer and the first conductive layer; and a second electrode electrically connected to the nanocore.

The at least one nitride semiconductor layer may be formed of $Al_xIn_yGa_{1-x-y}N$ ($0 \le x, y \le 1$, $x+y<1$).

The mask layer may include at least one of $SiO_2$, $TiO_2$, $Si_3N_4$, $Al_2O_3$, TiN, AlN, $ZrO_2$, TiAlN, and TiSiN.

The nanocore may be formed of a nitride semiconductor.

The emission layer may have a single- or multi-quantum well structure.

The first filling layer may be formed of an insulator.

The first filling layer may be formed of silicon on glass (SOG).

The second filling layer may be formed of an insulator or a conductor.

The first electrode may be a transparent electrode.

The nanorod light emitting device may further include a protective layer formed of silicon (Si) oxide, Si nitride, or titanium (Ti) nitride between the semiconductor layer and the first filling layer and between the mask layer and the first filling layer.

The nanorod light emitting device may further include a substrate formed under the at least one nitride semiconductor layer.

The substrate may be formed of sapphire, Si, or Si carbide (SiC).

According to another aspect of the present disclosure, there is provided a method of manufacturing a nanorod light emitting device, the method including stacking a mask layer on at least one nitride semiconductor layer; forming one or more through holes on the mask layer; growing nanocores doped with a first-type impurity on the at least one nitride semiconductor layer through the one or more through holes; forming an emission layer on surfaces of the nanocores; forming a semiconductor layer doped with a second-type impurity on a surface of the emission layer; filling spaces between the nanocores with a first filling layer; etching the first filling layer; vapor-depositing a first conductive layer on surfaces of the etched first filling layer and the semiconductor layer; forming a second filling layer on the first conductive layer between the nanocores; forming a first electrode on the second filling layer and the first conductive layer; and forming a second electrode electrically connected to the nanocores.

BRIEF DESCRIPTION OF THE DRAWINGS

Exemplary embodiments of the technology present disclosure present disclosure will be more clearly understood from the following detailed description taken in conjunction with the following figures.

DETAILED DESCRIPTION OF THE EMBODIMENTS

Hereinafter, the present disclosure will be described in detail by explaining embodiments of the present disclosure with reference to the attached drawings. In the drawings, like reference numerals denote like elements, and the size or thicknesses of each element may be exaggerated for ease of explanation. It will be understood that when a layer is referred to as being "on" another layer or substrate, it can be directly on the other layer or substrate, or intervening layers may also be present. Expressions such as "at least one," when preceding a list of elements, modify the entire list of elements and do not modify the individual elements of the list.

In one example, a light emitting crystal structure having a nanorod shape may be used to manufacture light emitting devices in order to reduce the occurrence of crystal defects. Such a structure may have a smaller area that comes in contact with the substrate in comparison with other types of structures including, for example, a structure having a thin film shape. Thus, a nanorod structure may be less prone to a mismatch in lattice constants or a difference in thermal expansion coefficients.

In a further example, a core-shell nanorod structure may be used to make the light emitting device. One of the advantages of the core-shell nanorod structure is that crystal defects may be minimized. General light emitting devices having a thin film structure primarily have two types of crystal defects: (1) a mismatch dislocation caused by a lattice mismatch between a quantum well layer formed of InGaN and a quantum barrier layer formed of GaN; and (2) a threading dislocation occurring on an interface between sapphire and GaN and reaching an emission layer in a direction in which a light emitting device structure grows. The first type of crystal defect, a mismatch dislocation, exists in parallel with a growth layer. In a nanorod structure, since a GaN layer may also grow in a horizontal direction, the dislocation lattice mismatch may be reduced in comparison with general light emitting devices having a thin film structure. Also, since an area of a nanorod structure on a semiconductor substrate is relatively small, only a part of any threading dislocation defect would propagate to an active layer. Further, even when dislocation occurs, the dislocation is likely to move to a near surface location and disappear. Second, since an active layer is formed along surfaces of cores in the form of a shell layer, an area of a light emitting surface may be increased in order to reduce the current density of the entire surface, thereby improving the luminous efficiency of a nanorod light emitting device.

Figure 1:
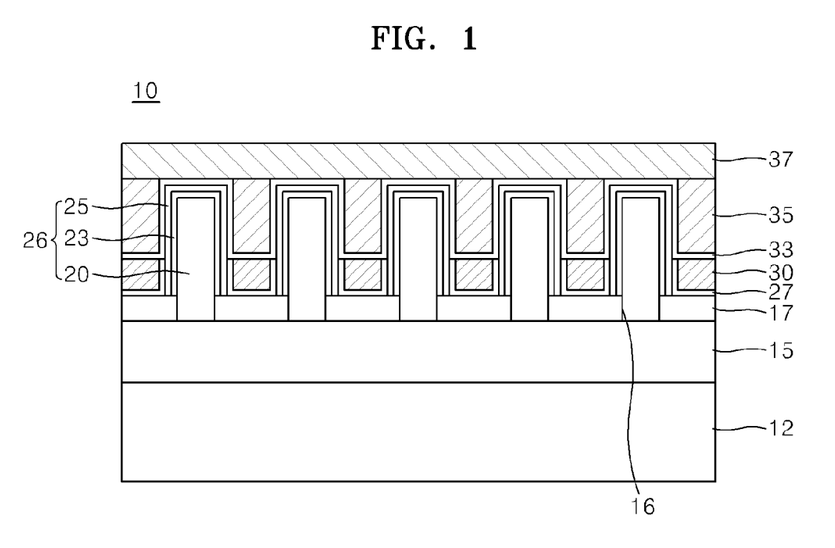
FIG. 1 is a cross-sectional view of a nanorod light emitting device.

FIG. 1 is a cross-sectional view of a nanorod light emitting device 10 according to an embodiment of the present disclosure. The nanorod light emitting device 10 may include at least one nitride semiconductor layer 15 and a mask layer 17 formed on the nitride semiconductor layer 15. The mask layer has through holes 16 spaced apart at a predetermined distance from each other. Light emitting nanorods 26 protrude from the through holes 16 of the mask layer 17.

In some implementations, the nitride semiconductor layer 15 may be formed on a substrate 12. For example, the substrate 12 may be used to grow the nitride semiconductor layer 15. The substrate 12 may be, for example and without limitation, a sapphire substrate, a silicon (Si) substrate, an Si carbide substrate, or a nitride substrate. In addition, the substrate 12 may be formed of a material for appropriately growing the nitride semiconductor layer 15. Examples of such material include, but are not limited to, ZnO, GaAs, $MgAl_2O_4$, MgO, $LiAlO_2$, $LiGaO_2$, or GaN. In some implementations, the substrate 12 may be removed from the electrode structure after the nanorod light emitting device 10 is completely manufactured.

In some implementations, the nitride semiconductor layer 15 may be formed of a nitride compound including gallium (Ga). The nitride semiconductor layer 15 may be formed as, for example, $Al_xIn_yGa_{1-x-y}N$ ($0 \leq x, y \leq 1$, $x+y<1$) using a material that includes GaN, InGaN, or AlInGaN. Further, the nitride semiconductor layer 15 may include a plurality of layers including, for example, a nucleation layer for promoting growth, and a buffer layer. Also, the nitride semiconductor layer 15 may be selectively undoped or doped.

The mask layer 17 may be patterned to grow the light emitting nanorods 26. The mask layer 17 may be formed of material including, for example, Si oxide, Si nitride, titanium (Ti) oxide, Ti nitride, aluminum (Al) oxide, or Al nitride. Accordingly, the mask layer 17 may include at least one of various compounds including, for example, $SiO_2$, $TiO_2$, $Si_3N_4$, $Al_2O_3$, TiN, AlN, $ZrO_2$, TiAlN, and TiSiN. As described above, the mask layer 17 may include the through holes 16 for partially exposing the nitride semiconductor layer 15. A specialized lithography process may be used to etch a desired through hole pattern in the mask layer 17. The through holes 16 may have a cross-sectional shape of, for example and without limitation, a circle, an oval, or a polygon.

In an example, the light emitting nanorods 26 are formed on the mask layer 17, as opposed to being formed through the through holes 16. Each of the light emitting nanorods 26 may include a nanocore 20 grown through the through holes 16, an emission layer 23 formed on the surface of the nanocore 20, and a semiconductor layer 25 formed on the surface of the emission layer 23.

The nanocore 20 may be formed as a nitride semiconductor layer and may be formed of, for example, $Al_xIn_yGa_{1-x-y}N$ ($0 \leq x, y \leq 1$, $x+y<1$). The nanocore 20 may be doped with a first-type impurity, for example, an n-type impurity. Examples of different elements that may be used as an n-type impurity includes, but are not limited to, Si, germanium (Ge), selenium (Se), or tellurium (Te).

The emission layer 23 is a layer for emitting light based on electron-hole recombination. The emission layer 23 may have a single- or multi-quantum well structure formed by, for example, periodically varying x, y, and z values of the compound AlxGayInzN so as to adjust an energy bandgap of an active layer of the semiconductor material. For example, a quantum well structure may be formed by using a quantum well layer and a barrier layer based on a compound pair including, but not limited to, InGaN/GaN, InGaN/InGaN, InGaN/AlGaN, or InGaN/InAlGaN. In some implementations, a light emitting wavelength band may be adjusted by controlling a bandgap energy of the InGaN layer according to a mole fraction of indium (In). Further, the emission layer 23 may be radially grown on the nanocores 20 so as to surround the surfaces of the nanocores 20.

The semiconductor layer 25 may be formed of a group □-□ semiconductor compound, for example, a nitride semiconductor. The semiconductor layer 25 may be formed of, for example, AlxInyGa1-x-yN (0≤x,y≤1, x+y<1). The semiconductor layer 25 may be doped with a second-type impurity, for example, a p-type impurity. Examples of different elements that may be used as a p-type impurity include, but are not limited to, boron (B), Al, magnesium (Mg), calcium (Ca), zinc (Zn), cadmium (Cd), mercury (Hg), or Ga may be used as a p-type impurity. It should be noted that in some implementations, the first-type impurity may be doped with a p-type impurity, rather than an n-type impurity, as described above, and the second-type impurity may be doped with an n-type impurity, rather than a p-type impurity. The nanocores 20 may supply electrons to the emission layer 23, and the semiconductor layer 25 may supply holes to the emission layer 23. The emission layer 23 may emit light due to a combination of the electrons and the holes supplied by the nanocores 20 and the semiconductor layer 25, respectively. As light is emitted from the surfaces of the light emitting nanorods 26, luminous efficiency may be improved by increasing the size of the light emission surface area. Accordingly, a large light emission surface area generally will have a higher luminous efficiency than a relatively smaller surface area.

A first filling layer 30 may be formed on the mask layer 17 between the light emitting nanorods 26. The first filling layer 30 may have a height less than the height of the light emitting nanorods 26. The first filling layer 30 may be formed of an insulator, for example, a wet filling material, e.g., silicon on glass (SOG), silicon on hardmask (SOH), or silicon on dielectric (SOD), or a dry filling material, e.g., chemical vapor deposition (CVD)-$SiO_2$, high density plasma (HDP)-$SiO_2$, or tetraethylorthosilicate (TEOS). In this way, the first filling layer 30 electrically insulates the light emitting nanorods 26, and thus, allows light to be emitted from the surfaces of the light emitting nanorods 26.

In an example, a first conductive layer 33 may be formed on the surfaces of the light emitting nanorods 26 and the first filling layer 30. A second filling layer 35 may be formed on the first conductive layer 33 between the light emitting nanorods 26. The second filling layer 35 may be formed of an insulator or a conductor. The insulator may be formed of the same material as the first filling layer 30. The conductor in this example may be formed of, for example, indium tin oxide (ITO) or a conductive polymer. The second filling layer 35 may fill, for example, remaining spaces between the light emitting nanorods 26. A first electrode 37 may be formed on the first conductive layer 33 and the second filling layer 35. The first electrode 37 may be a transparent electrode. The first electrode 37 may be formed of, for example, a transparent conductive material including, but not limited to, ITO, indium zinc oxide (IZO), ZnO, or $SnO_2$. Alternatively, in an example of a bottom emitting device for emitting light in a downward direction, the first electrode 37 may be formed of metal. In this example, if the first electrode 37 is formed of metal having a high reflectivity, light emitted from the emission layer 23 and proceeding toward the first electrode 37 may be reflected from the first electrode 37, thereby increasing light extraction efficiency of the light emitting device.

By injecting a current through the first electrode 37, which flows to the light emitting nanorods 26 through the first conductive layer 33, a current injection efficiency may be increased.

Meanwhile, a protective layer 27 may be further formed between the mask layer 17 and the first filling layer 30 and between the semiconductor layer 25 and the first filling layer 30. The protective layer 27 may be formed of, for example, Si oxide, Si nitride, or Ti nitride. When a current injected through the first electrode 37 flows through the first conductive layer 33, the first filling layer 30 may prevent the current from leaking without flowing to the emission layer 23. Also, the protective layer 27 may further prevent leakage of the current by allowing the first filling layer 30 to be better bonded to the mask layer 17 or the semiconductor layer 25. As such, the first filling layer 30 and the protective layer 27 may allow electrons and holes to be better combined in the emission layer 23.

Figure 2:
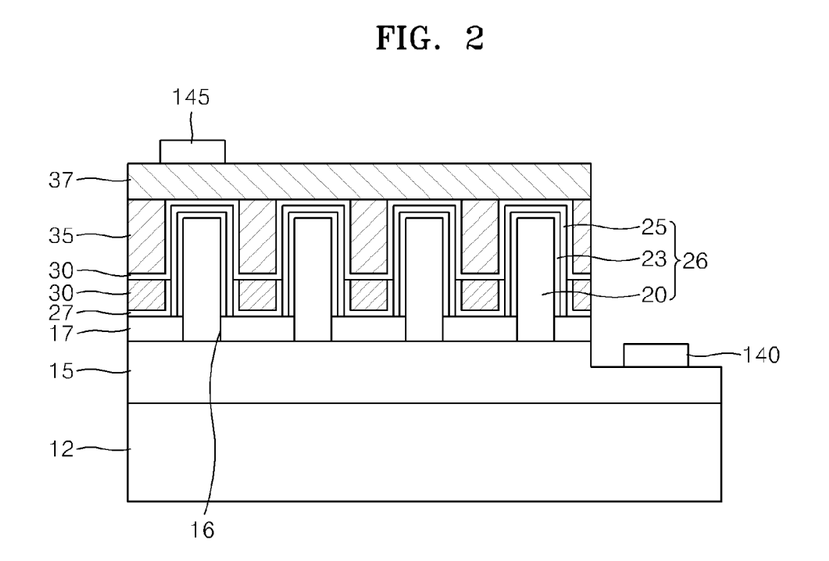
FIG. 2 is a cross-sectional view of an example of an electrode structure used in the nanorod light emitting device illustrated in FIG. 1.

FIG. 2 is a cross-sectional view of an example of an electrode structure used in the nanorod light emitting device 10 illustrated in FIG. 1. The nanorod light emitting device 10 may be mesa-etched to partially expose the nitride semiconductor layer 15, and a second electrode 140 may be formed on the exposed portion of the nitride semiconductor layer 15. An ohmic electrode 145 may be further formed on the first electrode 37. For example, if a sapphire substrate is used as the substrate 12, the electrode structure illustrated in FIG. 2 may be employed.

Figure 3:
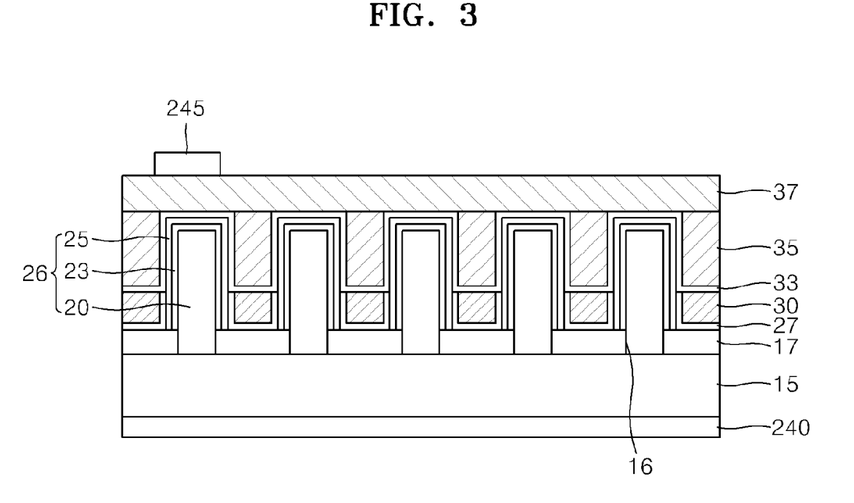
FIG. 3 is a cross-sectional view of another example of an electrode structure used in the nanorod light emitting device illustrated in FIG. 1.

FIG. 3 is a cross-sectional view of another example of an electrode structure used in the nanorod light emitting device 10 illustrated in FIG. 1. The substrate 12 may be removed from the nanorod light emitting device 10, and a second electrode 240 may be formed under the nitride semiconductor layer 15. For example, if a sapphire substrate is used as the substrate 12, the substrate 12 may be removed and the second electrode 240 may be formed. Alternatively, if a conductive substrate such as an Si substrate is employed as the substrate 12, the substrate 12 may not be removed and the second electrode 240 may be formed under the substrate 12. As described above, the second electrode 240 may be selectively formed according to the type of the substrate 12. Meanwhile, an ohmic electrode 245 may be further formed on the first electrode 37.

Figure 4:
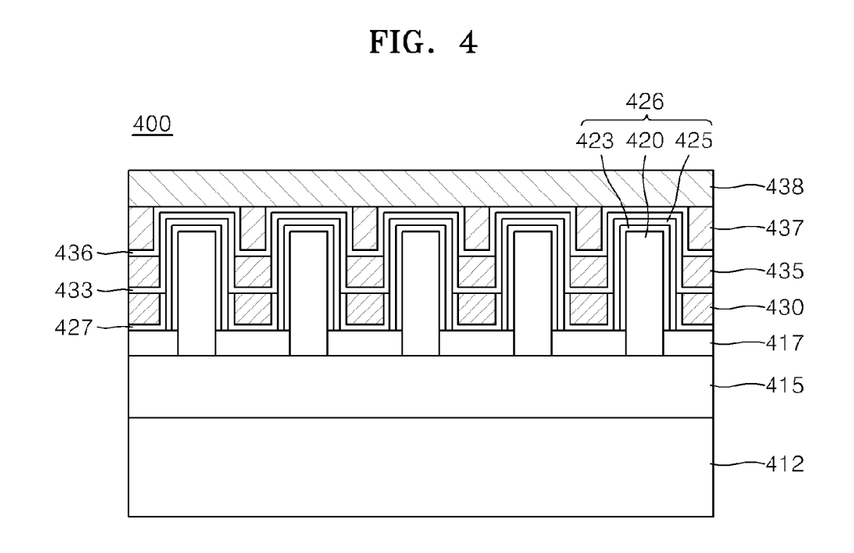
FIG. 4 is a cross-sectional view of another nanorod light emitting device.

FIG. 4 is a cross-sectional view of a nanorod light emitting device 400 according to another embodiment of the present disclosure. The nanorod light emitting device 400 may include at least one nitride semiconductor layer 415, a mask layer 417 formed on the nitride semiconductor layer 415 and having through holes 416, and light emitting nanorods 426 protruding from the through holes 416 of the mask layer 417.

A substrate 412 may be further formed under the nitride semiconductor layer 415. The substrate 412 is used to grow the nitride semiconductor layer 415 and may be, for example, a sapphire substrate, an Si substrate, an Si carbide substrate, or a nitride substrate. In addition, a substrate formed of a material for appropriately growing the nitride semiconductor layer 415, for example, ZnO, GaAs, $MgAl_2O_4$, MgO, $LiAlO_2$, $LiGaO_2$, or GaN, may be used. The substrate 412 may be removed after the nanorod light emitting device 400 is completely manufactured.

The nitride semiconductor layer 415 may be formed of nitride containing Ga. The nitride semiconductor layer 415 may be formed of AlxInyGa1-x-yN (0≤x,y≤1, x+y<1) and may be formed of, for example, a material containing GaN, InGaN, or AlInGaN. The nitride semiconductor layer 415 may include a plurality of layers, for example, a nucleation layer for promoting growth, and a buffer layer. The nitride semiconductor layer 415 may be selectively undoped or doped.

The mask layer 417 may be patterned to grow the light emitting nanorods 426. The mask layer 417 may be formed of, for example, Si oxide, Si nitride, Ti oxide, Ti nitride, Al oxide, or Al nitride. The mask layer 417 may include at least one of, for example, $SiO_2$, $TiO_2$, $Si_3N_4$, $Al_2O_3$, TiN, AlN, $ZrO_2$, TiAlN, and TiSiN. The mask layer 417 may include the through holes 416 for partially exposing the nitride semiconductor layer 415. The mask layer 417 may be etched in a desired through hole pattern by performing a lithography process. The through holes 416 may have a cross-sectional shape of, for example, a circle, an oval, or a polygon.

Each of the light emitting nanorods 426 may include a nanocore 420 grown through the through hole 416, an emission layer 423 formed on the surface of the nanocore 420, and a semiconductor layer 425 formed on the surface of the emission layer 423.

The light emitting nanorods 426 are substantially the same as the light emitting nanorods 26 illustrated in FIG. 1, and thus, a detailed description thereof is not provided here.

A first filling layer 430 may be formed on the mask layer 417 between the light emitting nanorods 426. The first filling layer 430 may have a height less than the height of the light emitting nanorods 426. The first filling layer 430 may be formed of an insulator and may be formed of, for example, SOG. The first filling layer 430 may electrically insulate the light emitting nanorods 426, and thus, may allow light to be emitted from the surfaces of the light emitting nanorods 426.

A first conductive layer 433 may be formed on the surfaces of the light emitting nanorods 426 and the first filling layer 430. A second filling layer 435 may be formed on the first conductive layer 433 between the light emitting nanorods 426. The second filling layer 435 may be formed of an insulator or a conductor. The second filling layer 435 may be filled to a certain height of the light emitting nanorods 426. A second conductive layer 436 may be formed on the surfaces of the first conductive layer 433 and the second filling layer 435. A third filling layer 437 may be formed in remaining spaces between the light emitting nanorods 426. A first electrode 438 may be formed on the third filling layer 437 and the second conductive layer 436. The first electrode 438 may be a transparent electrode. The first electrode 438 may be formed of, for example, a transparent conductive material such as ITO, IZO, ZnO, or $SnO_2$. Alternatively, in a bottom emitting device emitting light downward, the first electrode 438 may be formed of a metal.

Meanwhile, a protective layer 427 may be further formed between the mask layer 417 and the first filling layer 430 and between the semiconductor layer 425 and the first filling layer 430. The protective layer 427 may be formed of, for example, Si oxide, Si nitride, or Ti nitride. When a current injected through the first electrode 438 flows through the first conductive layer 433, the first filling layer 430 may prevent the current from leaking without flowing to the emission layer 423. Also, the protective layer 427 may further prevent the leakage of the current by allowing the first filling layer 430 to be better bonded to the mask layer 417 or the semiconductor layer 425. As such, the first filling layer 430 and the protective layer 427 may allow electrons and holes to be better combined in the emission layer 423.

As described above, in a nanorod light emitting device according to an embodiment of the present disclosure, since a filling layer and a conductive layer are formed as a multilayer and an electrode is formed thereon, a current may be injected from the top of the nanorod light emitting device. Therefore, the current may flow from the top to the bottom of light emitting nanorods, and thus, a current injection efficiency may be increased. As such, electrical characteristics and luminous efficiency may be increased.

Figure 5A:
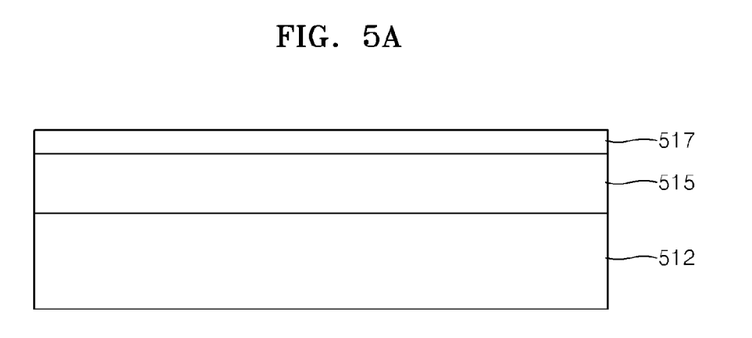
FIGS. 5A through 5I are different cross-sectional views of a nanorod light emitting device representing different steps of a process for manufacturing the nanorod light emitting device.
Figure 5B:
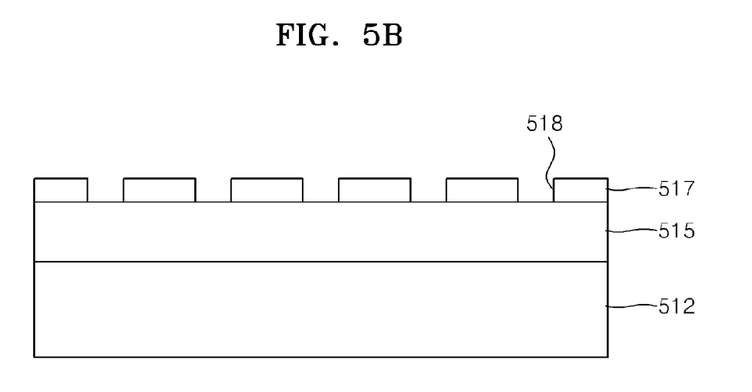

FIGS. 5A through 5I are cross-sectional views for describing a method of manufacturing a nanorod light emitting device, according to an embodiment of the present disclosure. Referring to FIG. 5A, at least one nitride semiconductor layer 515 is stacked on a substrate 512. The nitride semiconductor layer 515 may include a plurality of layers and may be selectively doped. A mask layer 517 is vapor-deposited on the nitride semiconductor layer 515 and is patterned as illustrated in FIG. 5B by performing a semiconductor process, so as to form through holes 518. The mask layer 517 may include at least one of, for example, $SiO_2$, $TiO_2$, $Si_3N_4$, $Al_2O_3$, TiN, AlN, $ZrO_2$, TiAlN, and TiSiN. The through holes 518 may expose the nitride semiconductor layer 515.

Figure 5C:
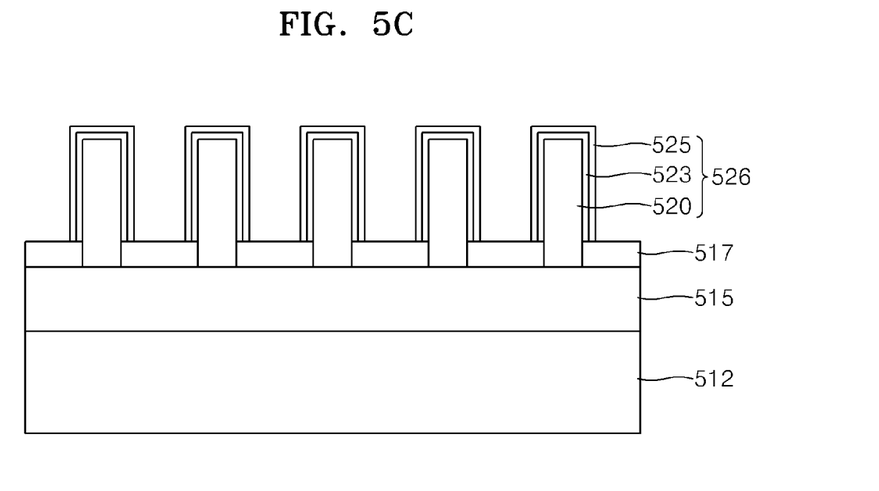
Figure 5D:
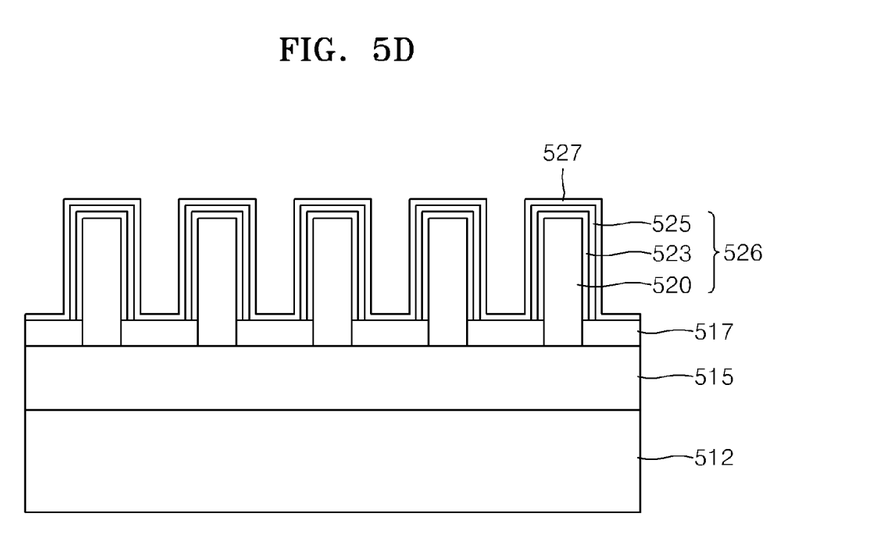
Figure 5E:
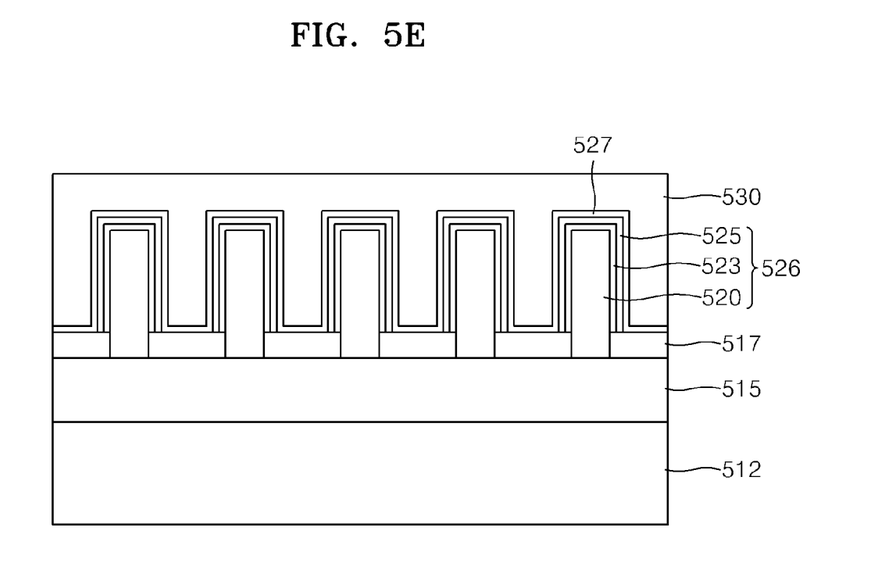
Figure 5F:
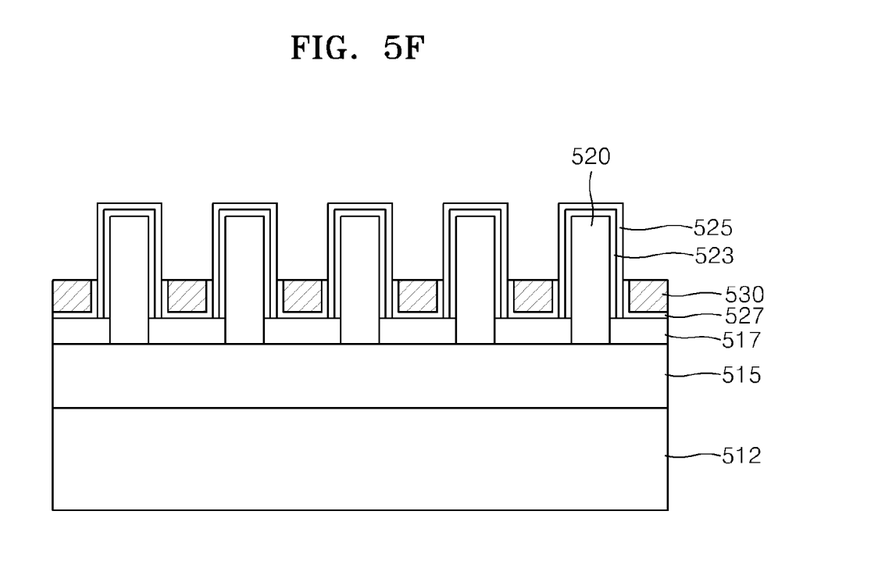

Referring to FIG. 5C, nanocores 520 are grown on the nitride semiconductor layer 515 through the through holes 518, and an emission layer 523 and a semiconductor layer 525 are sequentially vapor-deposited on the surfaces of the nanocores 520. Light emitting nanorods 526 including the nanocores 520, the emission layer 523, and the semiconductor layer 525 may be formed according to the pattern of the mask layer 517. Then, as illustrated in FIG. 5D, a protective layer 527 may be vapor-deposited. The protective layer 527 may be formed of, for example, $SiO_2$. Referring to FIG. 5E, a first filling layer 530 may be formed on the structure illustrated in FIG. 5D by using a wet or dry method. The first filling layer 530 may be formed of, for example, SOG. As illustrated in FIG. 5F, the first filling layer 530 may be partially etched to partially expose the semiconductor layer 525. Here, the protective layer 527 may be etched together with the first filling layer 530. The protective layer 527 may increase a bonding force between the first filling layer 530 and the semiconductor layer 525.

Figure 5G:
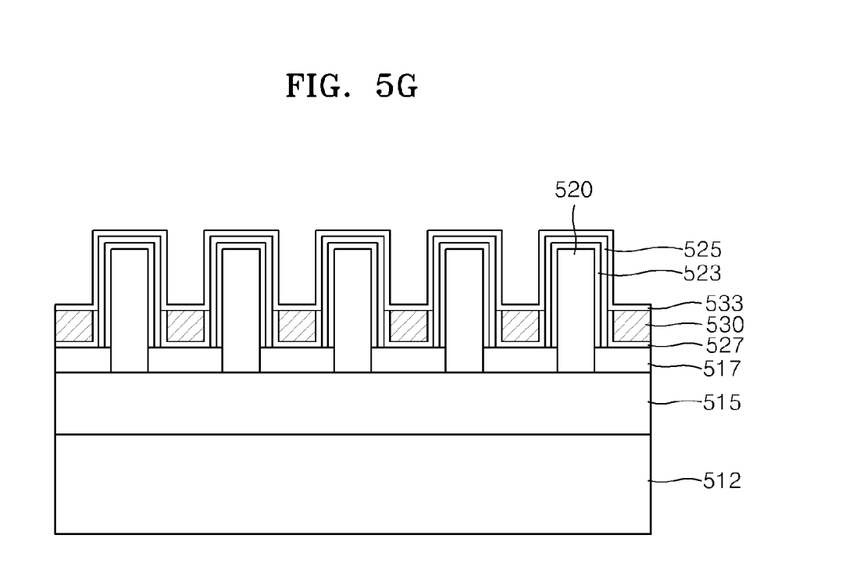
Figure 5H:
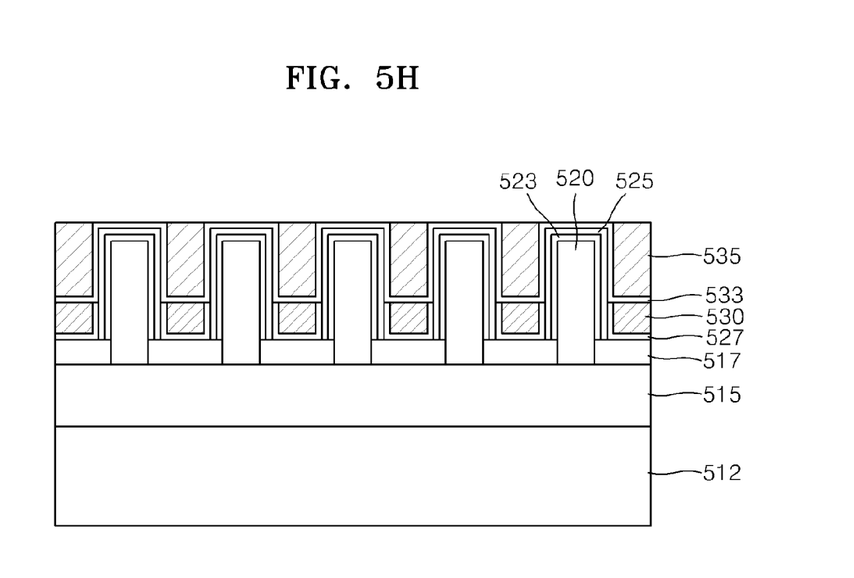
Figure 5I:
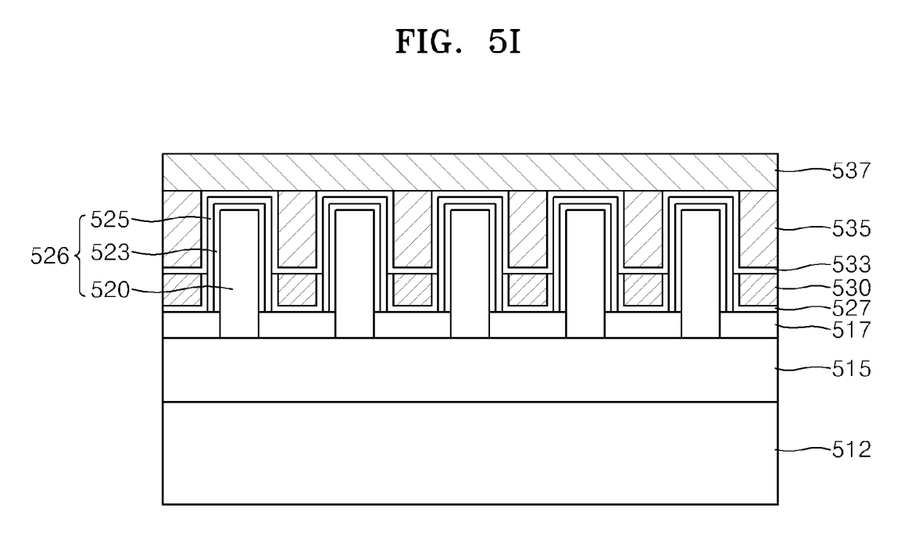

As illustrated in FIG. 5G, a conductive layer 533 is vapor-deposited on the first filling layer 530. Although it is appropriate to thickly vapor-deposit the conductive layer 533 to bury the light emitting nanorods 526, the conductive layer 533 may not easily have a large thickness. Accordingly, if the first filling layer 530 is filled to a certain height of spaces between the light emitting nanorods 526, the conductive layer 533 may be easily vapor-deposited. As illustrated in FIG. 5H, a second filling layer 535 is stacked on the conductive layer 533. The second filling layer 535 may fill remaining spaces between the light emitting nanorods 526. The second filling layer 535 may be formed of an insulator or a conductor. The second filling layer 535 may be formed of, for example, SOG. Referring to FIG. 5I, an electrode 537 may be formed on exposed portions of the conductive layer 533 and the second filling layer 535. If a current is injected through the electrode 537, the current may flow to the light emitting nanorods 526 through the conductive layer 533, and thus, a current injection efficiency may be increased. Due to a multi-layer structure of the first filling layer 530 and the second filling layer 535, the conductive layer 533 and the electrode 537 may be easily formed. Although double filling layers have been described above, multiple filling layers having more than two layers may also be used.

As an electrode structure, both a vertical structure in which two electrodes are separately formed on and under a nano light emitting device and a horizontal structure in which two electrodes are formed together on or under a nano light emitting device may be used.

While the present disclosure has been particularly shown and described with reference to exemplary embodiments thereof, it will be understood that various changes in form and details may be made therein without departing from the spirit and scope of the following claims.

What is claimed is:

1. A nanorod light emitting device comprising:
    at least one nitride semiconductor layer;
    a mask layer disposed on the at least one nitride semiconductor layer and having through holes;
    light emitting nanorods each comprising a nanocore protruding from the through hole and doped with a first-type impurity, an emission layer disposed on a surface of the nanocore, and a semiconductor layer disposed on a surface of the emission layer and doped with a second-type impurity;

a first filling layer disposed on the mask between the light emitting nanorods and having a height less than the height of the light emitting nanorods;

a first conductive layer disposed on surfaces of the semiconductor layer and the first filling layer; and a second filling layer disposed on the first conductive layer between the light emitting nanorods.

2. The nanorod light emitting device of claim 1, further comprising:

a first electrode disposed on the second filling layer and the first conductive layer; and a second electrode electrically connected to the nanocore.

3. The nanorod light emitting device of claim 1, wherein the at least one nitride semiconductor layer is formed of $Al_xIn_yGa_{1-x-y}N$ (0≤x, y≤1, x+y<1).

4. The nanorod light emitting device of claim 1, wherein the mask layer comprises at least one of $SiO_2$, $TiO_2$, $Si_3N_4$, $Al_2O_3$, TiN, AlN, $ZrO_2$, TiAlN, and TiSiN.

5. The nanorod light emitting device of claim 1, wherein the nanocore is formed of a nitride semiconductor.

6. The nanorod light emitting device of claim 1, wherein the emission layer has a single- or multi-quantum well structure.

7. The nanorod light emitting device of claim 1, wherein the first filling layer is formed of an insulator.

8. The nanorod light emitting device of claim 1, wherein the first filling layer is formed of silicon on glass (SOG).

9. The nanorod light emitting device of claim 1, wherein the second filling layer is formed of an insulator or a conductor.

10. The nanorod light emitting device of claim 1, wherein the first electrode is a transparent electrode.

11. The nanorod light emitting device of claim 1, further comprising a protective layer formed of silicon (Si) oxide, Si nitride, or titanium (Ti) nitride between the semiconductor layer and the first filling layer and between the mask layer and the first filling layer.

12. The nanorod light emitting device of claim 1, further comprising:

a second conductive layer disposed on a surface of the second filling layer and the first conductive layer; and a third filling layer disposed on the second conductive layer between the light emitting nanorods.

13. The nanorod light emitting device of claim 1, further comprising a substrate formed under the at least one nitride semiconductor layer.

14. The nanorod light emitting device of claim 13, wherein the substrate is formed of sapphire, Si, or Si carbide(SiC).

* * * * *